(12) United States Patent
Shao et al.

(10) Patent No.: US 9,927,561 B2
(45) Date of Patent: Mar. 27, 2018

(54) DISPLAY PANEL AND PIXEL STRUCTURE

(71) Applicant: TCL CORPORATION, Huizhou (CN)

(72) Inventors: Shiqiang Shao, Huizhou (CN); Xiaolin Yan, Huizhou (CN); Zhuo Gao, Huizhou (CN); Meifen Wu, Huizhou (CN); Dong Fu, Huizhou (CN)

(73) Assignee: TCL CORPORATION, Huizhou (CN)

( * ) Notice: Subject to any disclaimer, the term of this patent is extended or adjusted under 35 U.S.C. 154(b) by 286 days.

(21) Appl. No.: 14/719,369

(22) Filed: May 22, 2015

(65) Prior Publication Data
US 2015/0253476 A1 Sep. 10, 2015

Related U.S. Application Data

(63) Continuation of application No. PCT/CN2013/074583, filed on Apr. 24, 2013.

(30) Foreign Application Priority Data

Nov. 26, 2012 (CN) .......................... 2012 1 0486326

(51) Int. Cl.
*G02B 5/22* (2006.01)
*G02B 5/20* (2006.01)
(Continued)

(52) U.S. Cl.
CPC ....... *G02B 5/201* (2013.01); *G02F 1/133514* (2013.01); *G09G 3/2003* (2013.01);
(Continued)

(58) Field of Classification Search
CPC ............... G02B 5/201; G02F 1/133514; G02F 2201/52; G09G 3/2003; G09G 2300/0452;
(Continued)

(56) References Cited

U.S. PATENT DOCUMENTS 5,990,992 A * 11/1999 Hamanaka ........... G02B 3/0031
349/158
6,919,681 B2 * 7/2005 Cok ..................... G09G 3/3216
313/500

(Continued)

FOREIGN PATENT DOCUMENTS

CN 101075608 A 11/2007
CN 101118340 A 2/2008

(Continued)

OTHER PUBLICATIONS

The World Intellectual Property Organization (WIPO) International Search Report for PCT/CN2013/074583 Aug. 22, 2013.

*Primary Examiner* — Bumsuk Won
*Assistant Examiner* — Collin X Beatty
(74) *Attorney, Agent, or Firm* — ANOVA LAW GROUP, PLLC (57) ABSTRACT

A display panel is provided by the present disclosure. The display panel includes a plurality of repeatedly arranged display units each having an array of sub-pixels displaying a plurality of colors. In the display panel, a plurality of sub-pixels b displaying a first color are arranged in a first spatial isotropic configuration in the display panel, and a plurality of sub-pixels d displaying a second color are arranged in a second spatial isotropic configuration in the display panel. At least one of the first color and the second color contributes most to display resolution among the plurality of colors.

11 Claims, 5 Drawing Sheets

(51) Int. Cl.
  *G02F 1/1335* (2006.01)
  *G09G 3/20* (2006.01)
  *H01L 27/32* (2006.01)

(52) U.S. Cl.
  CPC . *G02F 2201/52* (2013.01); *G09G 2300/0452* (2013.01); *G09G 2320/0242* (2013.01); *G09G 2340/0407* (2013.01); *H01L 27/3213* (2013.01); *H01L 27/3218* (2013.01)

(58) Field of Classification Search
  CPC .... G09G 2320/0242; G09G 2340/0407; H01L 27/3213; H01L 27/3218
  USPC ......................................................... 359/891
  See application file for complete search history.

(56) References Cited

U.S. PATENT DOCUMENTS

| | | | |
|---|---|---|---|
| 2006/0146067 A1* | 7/2006 | Schweng | H04N 9/045 345/591 |
| 2009/0266978 A1* | 10/2009 | Lenchenkov | G02B 5/201 250/226 |
| 2011/0039195 A1* | 2/2011 | Einaga | G02B 5/201 430/7 |
| 2012/0147314 A1* | 6/2012 | Yoshizawa | G02B 5/201 349/144 |

FOREIGN PATENT DOCUMENTS

| | | |
|---|---|---|
| CN | 101364005 A | 2/2009 |
| CN | 202904169 U | 4/2013 |
| JP | 3292133 B2 | 6/2002 |

\* cited by examiner

DISPLAY PANEL AND PIXEL STRUCTURE

CROSS-REFERENCES TO RELATED APPLICATIONS

This application is a continuation application of PCT Patent Application No. PCT/CN2013/074583, filed on Apr. 24, 2013, which claims priority to Chinese Patent Application No. 201210486326.0, filed on Nov. 26, 2012, the content of all of which is incorporate herein by reference.

FIELD OF THE INVENTION

The present invention generally relates to the display technologies and, more particularly, relates to a pixel structure and a display panel containing the same.

BACKGROUND

Figure 1:
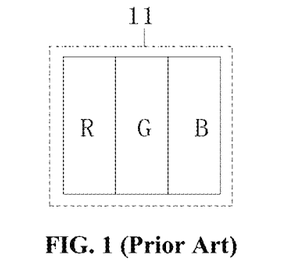
FIG. 1 illustrates a conventional pixel structure.
Figure 2:
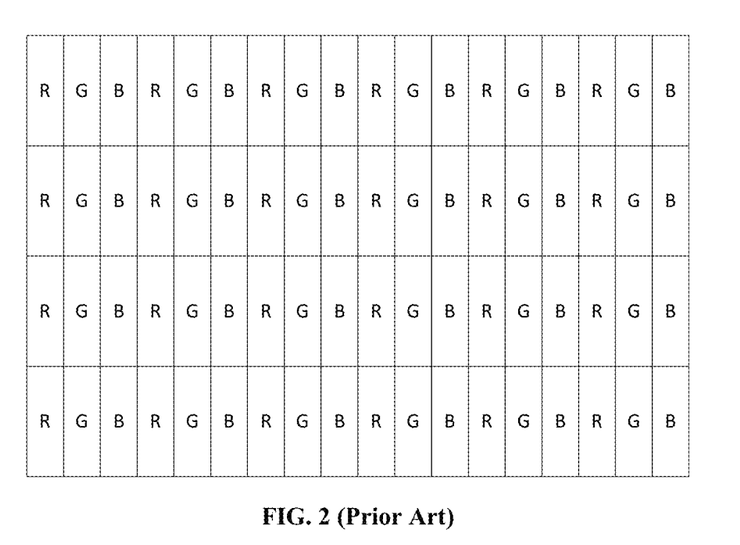
FIG. 2 illustrates a display panel formed from the pixel structure of FIG. 1.

Color filter array (CFA) is a key factor that affects the display resolution and color performance of a display apparatus (e.g., a display panel). The CFA of a conventional liquid crystal display (LCD) panel or an organic light-emitting diode (OLED) display panel often includes sub-pixels displaying red, green, and blue colors (also referred as the three primary colors). Sub-pixels are often arranged vertically in a row to form a pixel structure, and a plurality of identical pixel structures are arranged repeatedly horizontally and vertically to form the display panel. For example, FIG. 1 illustrates a pixel structure 11. The pixel structure 11 includes a red sub-pixel R, a green sub-pixel G, and a blue sub-pixel B. FIG. 2 illustrates the display panel formed by stacking/arranging the pixel structure 11 repeatedly. The display panel shown in FIG. 2 is capable of displaying images of various colors.

However, in the display panel illustrated in FIG. 2, sub-pixels displaying the same color may be arranged continuously along the vertical direction, but arranged discretely along the horizontal direction separated by two other sub-pixels. Fourier spectrum analysis can reveal that the arrangement of sub-pixels in the display panel of FIG. 2 may cause aliasing (also referred as spectral overlap) along the horizontal direction of the spectrum. Display effect of the display panel may be adversely affected.

As display technologies advance, users often demand better and improved visual effects. That is, the display panels are required to provide higher display resolution and improved color performance. However, conventional pixel structures and display panels have deficiencies. The disclosed methods and systems are directed to solve one or more problems set forth above and other problems.

BRIEF SUMMARY OF THE DISCLOSURE

The present invention addresses the above problems in the prior art. The present disclosure provides a pixel structure and a display panel incorporating the pixel structure. The present disclosure is directed to solve, for example, inferior display resolution and color performance in conventional display panels.

One aspect of the present disclosure includes a display panel. The display panel includes a plurality of repeatedly arranged display units each having an array of sub-pixels displaying a plurality of colors. In the display panel, a plurality of sub-pixels displaying a first color are arranged in a first spatial isotropic configuration in the display panel, and a plurality of sub-pixels displaying a second color are arranged in a second spatial isotropic configuration in the display panel. At least one of the first color and the second color contributes most to display resolution among the plurality of colors.

Another aspect of the present disclosure includes a pixel structure. The pixel structure includes a plurality of sub-pixels in an array structure each sub-pixel displaying one of a plurality of colors. When a plurality of pixel structures arranged repeatedly to form a display panel, a plurality of sub-pixels b displaying a first color are arranged in a first spatial isotropic configuration in the display panel, a plurality of sub-pixels d displaying a second color are arranged in a second spatial isotropic configuration in the display panel, and at least one of the first color and the second color contributes most to display resolution among the plurality of colors.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

For those skilled in the art to better understand the technical solution of the invention, reference will now be made in detail to exemplary embodiments of the invention, which are illustrated in the accompanying drawings. Wherever possible, the same reference numbers will be used throughout the drawings to refer to the same or like parts.

Figure 3:
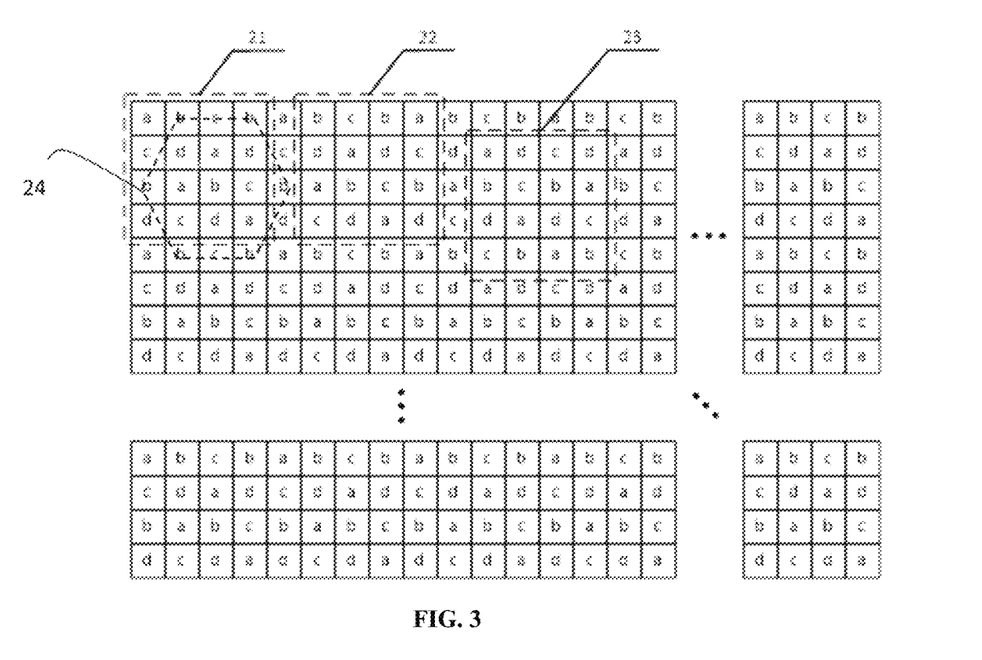
FIG. 3 illustrates an exemplary display panel consistent with the disclosed embodiments.

According to the disclosed embodiments, a display panel may be formed by a plurality of display units repeatedly arranged in both vertical and horizontal directions. Each display unit may be formed by an array of certain number of pixels or sub-pixels. For example, the display unit may be a 4 by 4 (4×4) pixel/sub-pixel array (i.e., having a 4×4 arrangement/structure) or a 2 by 8 (2×8) pixel/sub-pixel array (i.e., having a 2×8 arrangement/structure). FIG. 3 illustrates a 4×4 display unit.

As shown in FIG. 3, the display unit 21 may have a 4×4 structure. In the display unit 21, arranged from left to right of each row, the sub-pixels in the first row may be sub-pixel a, sub-pixel b, sub-pixel c, and sub-pixel b; the sub-pixels in the second row may be sub-pixel c, sub-pixel d, sub-pixel a, and sub-pixel d; the sub-pixels in the third row may be sub-pixel b, sub-pixel a, sub-pixel b, and sub-pixel c; and the sub-pixels in the fourth row may be sub-pixel d, sub-pixel c, sub-pixel d, and sub-pixel a.

The sub-pixels in display unit 21 (i.e., sub-pixel a, sub-pixel b, sub-pixel c, and sub-pixel d) may each display a different color.

In the display panel incorporating the display units 21 as described, the distribution of the sub-pixels may be more uniform, and sampling interval may be increased between sub-pixels displaying the same color. Difference between the sampling frequency along the horizontal direction and the sampling frequency along the vertical direction may be reduced. Thus, overall sampling frequency for the same-color sub-pixel may be more balanced/uniform.

In one embodiment, the sub-pixel a, the sub-pixel b, the sub-pixel c, and the sub-pixel d may each display any one of a red color, a green color, a blue color, and a white color. Compared to a conventional display panel, the display panel provided by the present disclosure may further include a sub-pixel displaying white such that the display brightness of the display panel can be improved, and the power consumption of the display panel can be reduced.

In the present disclosure, a sub-pixel displaying red color may be referred as a red sub-pixel. Similarly, sub-pixels displaying green color, blue color, and white color may each be referred as a green sub-pixel, a blue sub-pixel, and a white sub-pixel.

In certain embodiments, a sub-pixels a and a sub-pixels c may each be one of a red sub-pixel and a blue sub-pixel, and a sub-pixel b and a sub-pixel d may each be one of a green sub-pixel and a white sub-pixel. That is, the sub-pixel a may be a red sub-pixel and the sub-pixel c may be a blue sub-pixel, or sub-pixel a may be a blue sub-pixel and the sub-pixel c may be a red sub-pixel. The sub-pixel b may be a green sub-pixel and the sub-pixel d may be a white sub-pixel, or the sub-pixel b may be a white sub-pixel and the sub-pixel d may be a green sub-pixel.

Thus, the structure/configuration (i.e., represented as the color displayed by the corresponding sub-pixel) of the 4×4 display unit 21 can be described below. The sub-pixels in each row are described from left to right. In the four configurations as described below, R, G, B, and W may each represent a red sub-pixel, a green sub-pixel, a blue sub-pixel and a white sub-pixel.

The sub-pixels in the first row can be RGBG, the sub-pixels in the second row can be BWRW, the sub-pixels in the third row can be GRGB, and the sub-pixels in the fourth row can be WBWR.

Alternatively, the sub-pixels in the first row can be RWBW, the sub-pixels in the second row can be BGRG, the sub-pixels in the third row can be WRWB, and the sub-pixels in the fourth row can be GBGR.

Alternatively, the sub-pixels in the first row can be BGRG, the sub-pixels in the second row can be RWBW, the sub-pixels in the third row can be GBGR, and the sub-pixels in the fourth row can be WRWB.

Alternatively, the sub-pixels in the first row can be BWRW, the sub-pixels in the second row can be RGBG, the sub-pixels in the third row can be WBWR, and the sub-pixels in the fourth row can be GRGB.

Thus, in the display panel shown in FIG. 3, sub-pixels b and sub-pixels d may be arranged/distributed uniformly. For example, 6 sub-pixels b may surround one sub-pixel b, where each of the 6 sub-pixels b may have a shortest distance to the one sub-pixel b positioned in the center of the 6 sub-pixels. The 6 sub-pixels b may be distributed uniformly around the one sub-pixel b positioned in the center of the 6 sub-pixels to form a hexagon-shaped structure 24. The sub-pixels b may be distributed in the display panel with desired uniformity, and the spatial arrangement/orientation of the sub-pixels b may be more isotropic, i.e., having a spatial isotropic arrangement. Thus, the spatial sampling of sub-pixels b may have improved uniformity.

The arrangement/distribution of the sub-pixels d may be similar to the arrangement/distribution of the sub-pixels b. The spatial sampling of the sub-pixels d may also have desired uniformity. If the sub-pixels d display one of the green and white colors and sub-pixels d display the other of the green and white colors, the display resolution of the display panel may be improved. Since human eyes may be more sensitive to the spatial resolution of white and green than to the spatial resolution of blue and red, white sub-pixels and green sub-pixels may contribute considerably more to the display brightness of the display panel than red sub-pixels and blue sub-pixels.

When the size of a single sub-pixel is sufficiently small, human eyes may be more sensitive to the luminance of the single sub-pixel than to the chromaticity of the single sub-pixel. If the spatial sampling of white sub-pixels and green sub-pixels are sufficiently uniform, the display resolution of the display panel can be greatly improved. Because the sub-pixels a and sub-pixels c may contribute less to the display brightness than the sub-pixels b and sub-pixels d, the arrangement/distribution of sub-pixels a and sub-pixels c may not cause image distortion when a user is viewing the image. The arrangement of sub-pixels a and sub-pixels c may have little noticeable effect on the display resolution. The display panel can have desirably high display resolution. In other words, the white sub-pixels and the green sub-pixels may contribute most in the display brightness and/or display resolution among the sub-pixels of the display unit.

Further, as shown in FIG. 3, the display units to be stacked repeatedly to form the display panel may not be limited to only display units 21. Any suitable 4×4 sub-pixel array arranged consecutively in FIG. 3 may also form the display panel of FIG. 3. For example, display unit 22 or the display unit 23, selected from FIG. 3, may each represent the display unit to be stacked to form the display panel. Spatial sampling of the sub-pixels in the display panel formed by stacking/arranging display units 22 and/display units 23 may also have improved uniformity. In addition, the display panel provided by the present disclosure is not limited to the embodiments illustrated in FIG. 1. The display panel may also be formed through rotating, transposing and/or reversing the sub-pixels in the display panel illustrated in FIG. 3. The sub-pixels in the formed display panels may also have desired uniform spatial distribution/arrangement.

Figure 4:
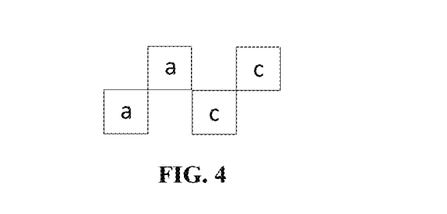
FIG. 4 illustrates an exemplary aa sub-pixel unit and an exemplary cc sub-pixel unit in the display panel of FIG. 3 consistent with the disclosed embodiments.

As shown in FIG. 3, in the display panel, except for the sub-pixels a on the edges of the display panel, each sub-pixel a may be surrounded by 8 adjacent sub-pixels (i.e., the sub-pixel a may be positioned in the center surrounded by the 8 adjacent sub-pixels). In the 8 adjacent sub-pixels, one sub-pixel may display the same color as the sub-pixel a surrounded by the 8 sub-pixels. That is, the one adjacent sub-pixel displaying the same color as the sub-pixel a positioned in the center may also be a sub-pixel a. Two adjacent sub-pixels a may form an aa sub-pixel unit. Similarly, two adjacent sub-pixels cc may form a cc sub-pixel unit, as shown in FIG. 4.

Although the display resolution of display panels is improving, human eyes may be less sensitive to blue sub-pixels and red sub-pixels than to green sub-pixels and white sub-pixels when the physical sizes of sub-pixels are sufficiently small (e.g., 300 Dpi). Thus, the two sub-pixels a in one aa sub-pixel unit may be controlled through one driving circuit and the driving circuit may be referred as the driving circuit for aa sub-pixel unit. The two sub-pixels c in one cc sub-pixel unit may be controlled by one driving circuit and the driving circuit may be referred as the driving circuit for cc sub-pixel unit. The arrangement/change described above may only cause minimal impact on the display resolution such that the arrangement may not be noticeable. The arrangement described above may also reduce the number of driving circuits used in the display panel so that the driving circuits may require less space. Average aperture ratio of the display panel may be increased and power consumption of the display panel may be reduced. The improvements described above may be essential to a high-resolution display panel.

Figure 5:
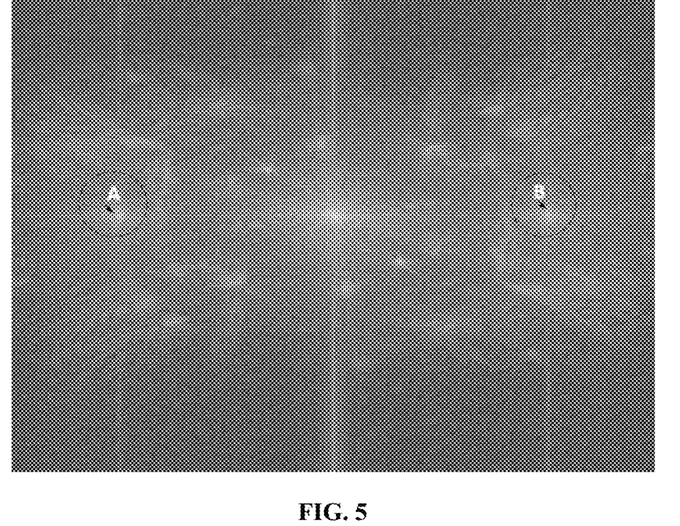
FIG. 5 illustrates a spectrogram of the display panel of FIG. 2.

For illustrative purposes, spectrogram of the display panel of FIG. 3 is compared with the spectrogram of the display panel of FIG. 2. FIG. 5 illustrates the spectrogram of the display panel of FIG. 2.

As shown in FIG. 5, point A and point B (circled in dashed lines) may represent points with concentrated frequencies. That is, point A and point B have relatively more concentrated spectrum. Referring to the arrangement of sub-pixels in the display panel of FIG. 2, point A and point B may be caused by discrete sampling of the sub-pixels with the same color. For example, as shown in FIG. 2, the sampling of the red sub-pixels may be continuous along the vertical direction and discrete along the horizontal direction such that the sampling frequency of the red sub-pixels along the vertical direction may differ from the sampling frequency of the red sub-pixels along the horizontal direction.

However, for human eyes, the viewing of images may be isotropic, i.e., human eyes may not distinguish images along the horizontal direction and along the vertical direction. In the spectrogram shown in FIG. 5, the distribution of focal points representing higher frequency concentration may not be isotropic, i.e., visual difference may be caused by such distribution in human eyes, and the arrangement/distribution of the sub-pixels in the conventional display panels need to be improved.

Figure 6:
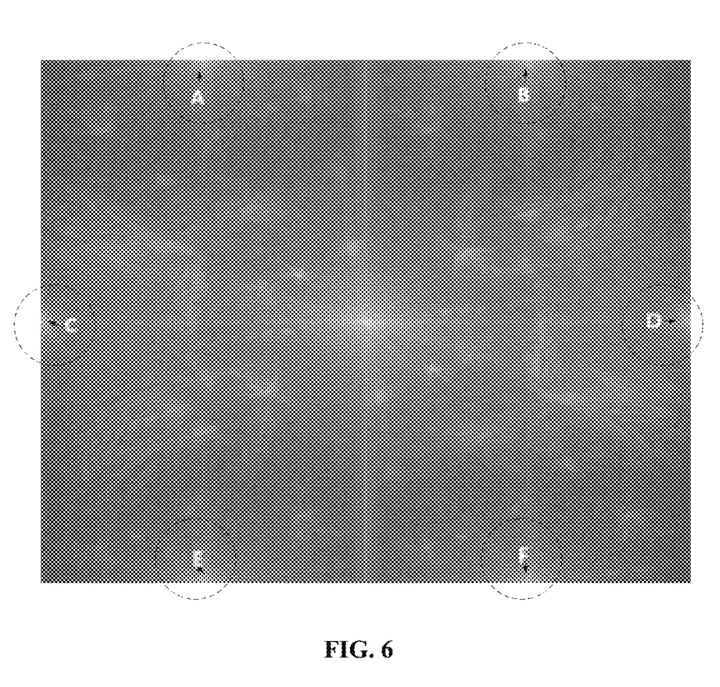
FIG. 6 illustrates a spectrogram of the display panel of FIG. 3 consistent with the disclosed embodiments.

In the spectrogram shown in FIG. 6, instead of two focal points, six focal points, i.e., A, B, C, D, E, and F (circled in dashed lines), may appear, which are distributed in a circular structure. The circular structure may be similar to an isotropic distribution and thus may match the viewing characteristics of human eyes. Thus, the display resolution of the display panel of FIG. 3 may be more desired compared to conventional display panels.

In addition to structures shown in FIG. 3, other embodiments provided by the present disclosure may also provide improved distribution of sub-pixels b and sub-pixels d such that the spatial arrangement of sub-pixels b and sub-pixels d can be isotropic. The display resolution of the display panels can then be improved.

Figure 7:
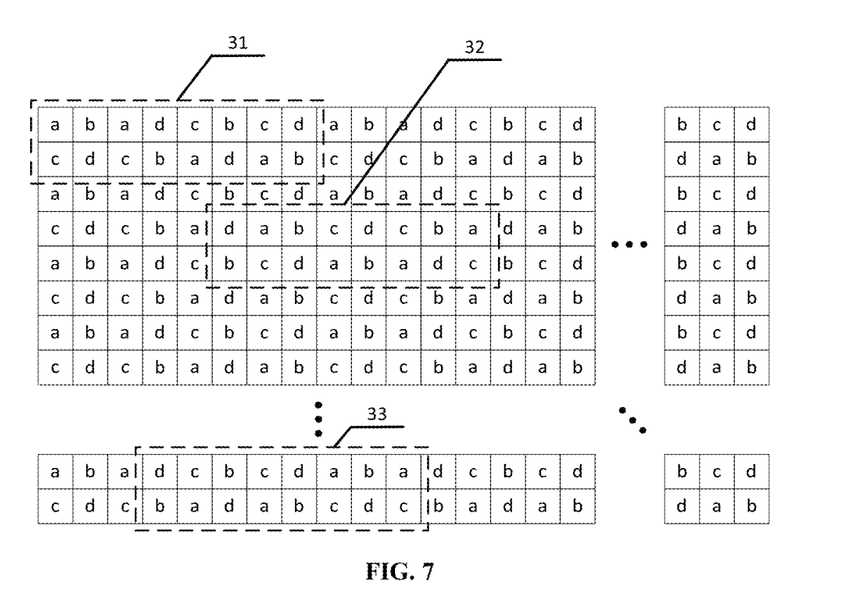
FIG. 7 illustrates another exemplary display panel consistent with the disclosed embodiments.
Figure 8:
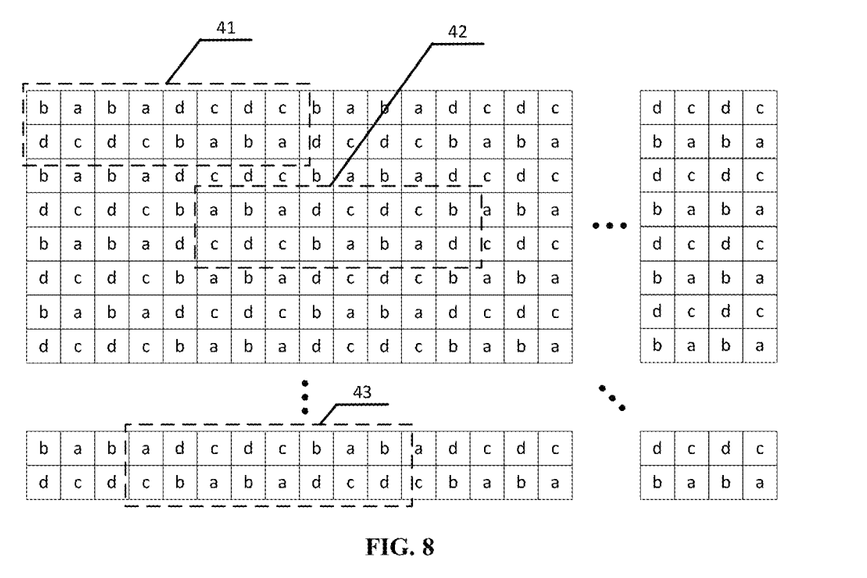
FIG. 8 illustrates another exemplary display panel consistent with the disclosed embodiments.
Figure 9:
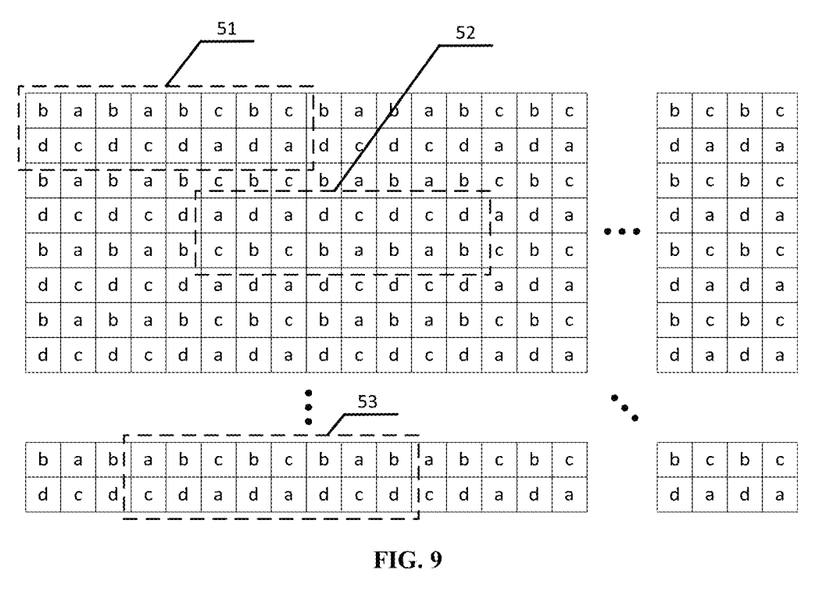
FIG. 9 illustrates another exemplary display panel consistent with the disclosed embodiments.

The structure of sub-pixels in a display unit having a 2×8 configuration may be selected from one of the following combinations/configurations. FIGS. 7 to 9 illustrate such 2×8 display units. In the display units illustrated in FIGS. 7 to 9, the sub-pixels in each row may be described from left to right.

As shown in FIG. 7, in the display unit 31, the sub-pixels in the first row may be sub-pixel a, sub-pixel b, sub-pixel a, sub-pixel d, sub-pixel c, sub-pixel b, sub-pixel c, and sub-pixel d; and the sub-pixels in the second row may be sub-pixel c, sub-pixel d, sub-pixel c, sub-pixel b, sub-pixel a, sub-pixel d, and sub-pixel a, and sub-pixel b.

As shown in FIG. 8, in the display unit 41, the sub-pixels in the first row may be sub-pixel b, sub-pixel a, sub-pixel b, sub-pixel a, sub-pixel d, sub-pixel c, sub-pixel d, and sub-pixel c; and the sub-pixels in the second row may be sub-pixel d, sub-pixel c, sub-pixel d, sub-pixel c, sub-pixel b, sub-pixel a, and sub-pixel b, and sub-pixel a.

As shown in FIG. 9, in the display unit 51, the sub-pixels in the first row may be sub-pixel b, sub-pixel a, sub-pixel b, sub-pixel a, sub-pixel b, sub-pixel c, sub-pixel b, and sub-pixel c; and sub-pixels in the second row may be sub-pixel d, sub-pixel c, sub-pixel d, sub-pixel c, sub-pixel d, sub-pixel a, and sub-pixel d, and sub-pixel a.

In the three display units with the 2×8 arrangement/configuration as described above, the sub-pixel a, the sub-pixel b, the sub-pixel c, and the sub-pixel d may each display one of the red, green, blue, and white colors. Each sub-pixel may display a color different from the other sub-pixels.

In some embodiments, the sub-pixel a may be one of a red sub-pixel and a blue sub-pixel, and the sub-pixel c may be the other of a red sub-pixel and the blue sub-pixel. The sub-pixel b may be one of a green sub-pixel and a white sub-pixel, and the sub-pixel d may be the other of a green sub-pixel and a white sub-pixel.

That is, the sub-pixel a and the sub-pixel c may be the red sub-pixel and the blue sub-pixel, or the sub-pixel a and the sub-pixel c may be the blue sub-pixel and the red sub-pixel. The sub-pixel b and the sub-pixel d may be the green sub-pixel and the white sub-pixel, or the sub-pixel b and the sub-pixel d may be the white sub-pixel and the green sub-pixel. The reason for the arrangement described above is illustrated below.

According to the FIG. 7, the structure of the sub-pixels in display unit 31 can be one of the following combinations/configurations. The sub-pixels of each row are described from left to right. In the display units as described below, R may represent a red sub-pixel, G may represent a green sub-pixel, B may represent a blue sub-pixel, and W may represent a white sub-pixel.

The sub-pixels in the first row may be RGRWBGBW, and the sub-pixel in the second row may be BWBGRWRG.

The sub-pixels in the first row may be BGBWRGRW, and the sub-pixel in the second row may be RWRGBWBG.

The sub-pixels in the first row may be RWRGBWBG, and the sub-pixel in the second row may be BGBWRGRW.

The sub-pixels in the first row may be BWBGRWRG, and the sub-pixel in the second row may be RGRWBGBW.

Thus, in the display panel with such display units as shown in FIG. 7, each sub-pixel b may be surrounded by 6 sub-pixels b. That is, each sub-pixel b has 6 sub-pixels b with a shortest distance to each sub-pixel 6. Each of the 6 sub-pixels b may have a shortest distance to the sub-pixel positioned in the center surrounded by the 6 sub-pixels b. The arrangement of the 6 sub-pixels may be similar to a hexagon such that the spatial arrangement of the sub-pixels b may be isotropic. Similarly, the spatial arrangement of the sub-pixels d may be isotropic. Thus, as sub-pixels b and c are the white sub-pixels and the green sub-pixels, the spatial sampling of the white sub-pixels and the green sub-pixels may have improved uniformity. The display resolution of the display panel may be improved.

Because sub-pixels a and sub-pixels c are the red sub-pixels and blue sub-pixels, the spatial arrangement of sub-pixels a and sub-pixels c may not be as strict as the spatial arrangement of sub-pixels b and d. Details for the reason of arranging sub-pixels a and sub-pixels c are described previously and are omitted herein.

Further, the display units to be stacked repeatedly to form the display panel of FIG. 7 may not be limited to display units 31. Any suitable sub-pixel array with a 2×8 configuration, consecutively arranged in the display panel of FIG. 7, may also form the display panel of FIG. 7. For example, as shown in FIG. 7, display unit 32 and/or display unit 33 may also form the display panel of FIG. 7. In addition, by rotating, transposing, and reversing the sub-pixel arrays in the display panel of FIG. 7, new arrangement of the display panel may be formed. The new arrangement may also provide desired uniform spatial sampling of the white sub-pixels and green sub-pixels. Display resolution of the display panel may be improved.

The display panels of FIGS. 8 and 9 may be similar to the display panel of FIG. 7. Although the arrangement of the sub-pixels b in the display panels of FIGS. 8 and 9 may not have a hexagon-shaped configuration as the arrangement of the sub-pixels b in the display panel of FIG. 7, the configuration/arrangement of the sub-pixels in the display panels of FIGS. 8 and 9 may still enable the spatial arrangement of the sub-pixels b to be isotropic. Similarly, the spatial arrangement of the sub-pixels d may also be isotropic in the display panels of FIGS. 8 and 9. The spatial arrangement of sub-pixels a and sub-pixels c may not be as strict as the arrangement of sub-pixels b and d in this case. Details of reason for arranging sub-pixels a and sub-pixels c are described previously and are omitted herein.

FIG. 8 illustrates another display unit 41. According to the FIG. 8, the structure of sub-pixels in display unit 41 can be one of the following combinations.

The sub-pixels in the first row may be GRGRWBWB, and the sub-in the second row may be WBWBGRGR.

The sub-pixels in the first row may be GBGBWRWR, and the sub-in the second row may be WRWRGBGB.

The sub-pixels in the first row may be WRWRGBGB, and the sub-in the second row may be GBGBWRWR.

The sub-pixels in the first row may be WBWBGRGR, and the sub-in the second row may be GRGRWBWB.

Thus, in the display panel with such display units as shown in FIG. 8, each sub-pixel b may be surrounded by 6 sub-pixels b. That is, each sub-pixel b has 6 sub-pixels b with a shortest distance to each sub-pixel 6. Each of the 6 sub-pixels b may have a shortest distance to the sub-pixel positioned in the center surrounded by the 6 sub-pixels b. The spatial arrangement of the sub-pixels b may be isotropic. Similarly, the spatial arrangement of the sub-pixels d may be isotropic. Thus, as sub-pixels b and c are the white sub-pixels and the green sub-pixels, the spatial sampling of the white sub-pixels and the green sub-pixels may have improved uniformity. The display resolution of the display panel may be improved.

Because sub-pixels a and sub-pixels c are the red sub-pixels and blue sub-pixels, the spatial arrangement of sub-pixels a and sub-pixels c may not be as strict as the spatial arrangement of sub-pixels b and d. Details for the reason of arranging sub-pixels a and sub-pixels c are described previously and are omitted herein.

The display units to be stacked repeatedly to form the display panel of FIG. 8 may not be limited to display units 41. Any suitable sub-pixel array with a 2×8 configuration, consecutively arranged in the display panel of FIG. 8, may also form the display panel of FIG. 8. For example, display unit 42 and/or display unit 43 may also form the display panel of FIG. 8. By rotating, transposing, and reversing the sub-pixel arrays in the display panel of FIG. 8, new arrangement of the display panel may be formed. The new arrangement of may also provide desired uniform spatial sampling of the white sub-pixels and green sub-pixels. Display resolution of the display panel may be improved.

According to the FIG. 9, the structure of sub-pixels in display unit 51 can be one of the following combinations.

The sub-pixels in the first row may be GRGRGBGB, and the sub-in the second row may be WBWBWRWR.

The sub-pixels in the first row may be GBGBGRGR, and the sub-in the second row may be WRWRWBWB.

The sub-pixels in the first row may be WRWRWBWB, and the sub-in the second row may be GBGBGRGR.

The sub-pixels in the first row may be WBWBWRWR, and the sub-in the second row may be GRGRGBGB.

Thus, in the display panel with such display units as shown in FIG. 9, each sub-pixel b may be surrounded by 8 sub-pixels b. That is, each sub-pixel b has 8 sub-pixels b with a shortest distance to each sub-pixel 6. Each of the 8 sub-pixels b may have a shortest distance to the sub-pixel positioned in the center surrounded by the 6 sub-pixels b. The spatial arrangement of the sub-pixels b may be isotropic. Similarly, the spatial arrangement of the sub-pixels d may be isotropic. Thus, as sub-pixels b and c are the white sub-pixels and the green sub-pixels, the spatial sampling of the white sub-pixels and the green sub-pixels may have improved uniformity. The display resolution of the display panel may be improved.

Because sub-pixels a and sub-pixels c are the red sub-pixels and blue sub-pixels, the spatial arrangement of sub-pixels a and sub-pixels c may not be as strict as the spatial arrangement of sub-pixels b and d. Details for the reason of arranging sub-pixels a and sub-pixels c are described previously and are omitted herein.

The display units to be stacked repeatedly to form the display panel of FIG. 9 may not be limited to display units 51. Similarly, any suitable sub-pixel array with a 2×8 configuration, consecutively arranged in the display panel of FIG. 9, may also form the display panel of FIG. 9. For example, display unit 52 and/or display unit 53 may also form the display panel of FIG. 9. By rotating, transposing, and reversing the sub-pixel arrays in the display panel of FIG. 9, new arrangement of the display panel may be formed. The new arrangement may also provide desired uniform spatial sampling of the white sub-pixels and green sub-pixels. Display resolution of the display panel may be improved. Further, in the display units described above (i.e., including the sub-pixel arrays with 4×4 and 2×8 configurations), the aspect ratio of each sub-pixel (e.g., the sub-pixel a, the sub-pixel b, the sub-pixel c, or the sub-pixel d) may be approximately 1:2. That is, the ratio between the width of the sub-pixel to the length of the sub-pixel may be approximately 1:2. In the display panels of FIGS. 7 and 8, when the aspect ratio of each sub-pixel is approximately 1:2, the spatial arrangement of the sub-pixels b and sub-pixels d may be isotropic. The display resolution may be further improved. It should be noted that the width, length, and aspect ratio of sub-pixels shown in the FIGS. 3 and 4 and FIGS. 7 to 9 are only for illustrative purposes and may not reflect the true values of width, length, and aspect ratio. The aspect ratio of a sub-pixel can also be other suitable values. In certain embodiments, the aspect ratio of each sub-pixel in a display unit with a 4×4 configuration may be approximately 1:1.

Based on the above display panels, the present disclosure also provides a pixel structure. The pixel structure may be any suitable 4×4 sub-pixel array arranged consecutively in the display panel formed by the 4×4 arranged display units provided in the present disclosure. Alternatively, the pixel structure may be any suitable 2×8 sub-pixel array arranged consecutively in the display panel formed by the 2×8 arranged display units provided in the disclosure. That is, by stacking/arranging the disclosed pixel structures repeatedly, the display panel provided by the present disclosure can be formed.

Specifically, the pixel structure may be the display unit illustrated in FIG. 3. That is, the pixel structure may be the 4×4 arranged sub-pixel array. In the pixel structure, arranged from left to right, the sub-pixels in the first row may be sub-pixel a, sub-pixel b, sub-pixel c, and sub-pixel b; the sub-pixels in the second row may be sub-pixel c, sub-pixel d, sub-pixel a, and sub-pixel d; the sub-pixels in the third row may be sub-pixel b, sub-pixel a, sub-pixel b, and sub-pixel c; and the sub-pixels in the fourth row may be sub-pixel d, sub-pixel c, sub-pixel d, and sub-pixel a.

It should be noted that, the pixel structure provided by the present disclosure may be but is not limited to the display unit illustrated in FIG. 3. The pixel structure can also be any suitable 4×4 arranged sub-pixel array arranged consecutively in the display panel formed by the 4×4 arranged display units provided in the present disclosure.

The pixel structure may also be any one of the display units illustrated in FIGS. 7 to 9. That is, when the pixel structure is a 2×8 sub-pixel array illustrated in FIGS. 7 to 9, the structure of the pixel structure can be any one of the following combinations/configurations. The sub-pixels in each row are described from left to right.

The sub-pixels in the first row may be sub-pixel a, sub-pixel b, sub-pixel a, sub-pixel d, sub-pixel c, sub-pixel b, sub-pixel c, and sub-pixel d; and the sub-pixels in the second row may be sub-pixel c, sub-pixel d, sub-pixel c, sub-pixel b, sub-pixel a, sub-pixel d, sub-pixel a, and sub-pixel b.

The sub-pixels in the first row may be sub-pixel b, sub-pixel a, sub-pixel b, sub-pixel a, sub-pixel d, sub-pixel c, sub-pixel d, and sub-pixel c; and the sub-pixels in the second row may be sub-pixel d, sub-pixel c, sub-pixel d, sub-pixel c, sub-pixel b, sub-pixel a, sub-pixel b, and sub-pixel a.

The sub-pixels in the first row may be sub-pixel b, sub-pixel a, sub-pixel b, sub-pixel a, sub-pixel b, sub-pixel c, sub-pixel b, and sub-pixel c; and the sub-pixels in the second row may be sub-pixel d, sub-pixel c, sub-pixel d, sub-pixel c, sub-pixel d, sub-pixel a, sub-pixel d, and sub-pixel a.

Each of the sub-pixel a, the sub-pixel b, the sub-pixel c, and the sub-pixel d may be one of a red sub-pixel, a green sub-pixel, a blue sub-pixel, and a white sub-pixel. The advantages of the arrangement of the pixel structure are described previously and are omitted herein.

It should be noted that, the pixel structure provided by the present disclosure may be but is not limited to the display unit illustrated in FIGS. 7 to 9. The pixel structure can also be any suitable 2×8 arranged sub-pixel array arranged consecutively in the display panel formed by the 2×8 arranged display units provided in the present disclosure.

In certain embodiments, a display unit provided by the present disclosure may include more than one of the pixel structures disclosed. In certain other embodiments, a display unit may include only one of the pixel structure disclosed. When the display unit includes only one pixel structure, the configurations of the display unit can be represented by the configuration of the sub-pixel array included (i.e., a 4×4 or 2×8 arranged pixel array). However, because the pixel structure can be any suitable repeating 4×4 or 2×8 arranged sub-pixel array in the display panel, when the display unit only includes one pixel structure disclosed, the configuration of the sub-pixel array may be or is not limited to the display unit provided by the present disclosure.

Thus, the disclosed display panel and pixel structures may provide several advantages. By improving/optimizing the arrangement of sub-pixels in the display panel and pixel structure disclosed, spatial sampling of the sub-pixels may have improved uniformity. Display resolution of the display panel can be improved. Also, by introducing white sub-pixels, the display brightness of the display panel can be improved and power consumption of the display panel can be reduced. Further, by controlling sub-pixels in an aa sub-pixel unit through a same driving circuit and controlling sub-pixels in a cc sub-pixel unit through a same driving circuit, the power consumption of the display panel can be further reduced. The aperture ratio of the display panel may also be improved.

It should be understood that the above embodiments disclosed herein are exemplary only and not limiting the scope of this disclosure. Without departing from the spirit and scope of this invention, other modifications, equivalents, or improvements to the disclosed embodiments are obvious to those skilled in the art and are intended to be encompassed within the scope of the present disclosure.

What is claimed is:

1. A display panel, comprising:
a plurality of repeatedly arranged display units each having an array of sub-pixels displaying a plurality of colors, wherein:
 a plurality of sub-pixels b displaying a first color are arranged in a first spatial isotropic configuration in the display panel;
 a plurality of sub-pixels d displaying a second color are arranged in a second spatial isotropic configuration in the display panel;
 a plurality of sub-pixels a displaying a third color;
 a plurality of sub-pixels c displaying a fourth color; and
 at least one of the first color and the second color contributes most to display resolution among the plurality of colors, wherein
the first color is green and the second color is white; and
each of the sub-pixels displaying white is surrounded by six sub-pixels displaying white such that the six sub-pixels form a hexagon-shaped structure, wherein sub-pixels arranged from left to right of each row of the display panel have one of following configurations including:
 sub-pixel a, sub-pixel b, sub-pixel a, sub-pixel d, sub-pixel c, sub-pixel b, sub-pixel c, and sub-pixel d; sub-pixel c, sub-pixel d, sub-pixel c, sub-pixel b, sub-pixel a, sub-pixel d, and sub-pixel a, and sub-pixel b;
 sub-pixel b, sub-pixel a, sub-pixel b, sub-pixel a, sub-pixel d, sub-pixel c, sub-pixel d, and sub-pixel c; sub-pixel d, sub-pixel c, sub-pixel d, sub-pixel c, sub-pixel b, sub-pixel a, and sub-pixel b, and sub-pixel a; and
 sub-pixel b, sub-pixel a, sub-pixel b, sub-pixel a, sub-pixel b, sub-pixel c, sub-pixel b, and sub-pixel c; sub-pixel d, sub-pixel c, sub-pixel d, sub-pixel c, sub-pixel d, sub-pixel a, and sub-pixel d, and sub-pixel a,
wherein each of the sub-pixel a, the sub-pixel b, the sub-pixel c, and the sub-pixel d displays a color different from one another.

2. The display panel according to claim 1, wherein the sub-pixels in a display unit include at least one sub-pixel a, at least one sub-pixel b, at least one sub-pixel c, and at least one sub-pixel d.

3. The display panel according to claim 1, wherein the plurality of different colors are a red color, a green color, a blue color, and a white color.

4. The display panel according to claim 1, wherein each of the sub-pixels displays one of the red color, the green color, the blue color, and the white color.

5. The display panel according to claim 3, wherein:
the sub-pixels a and the sub-pixels c each displays one of a red color and a blue color; and
the sub-pixels b and the sub-pixels d each displays one of a green color and a white color.

6. A display panel, comprising:
a plurality of repeatedly arranged display units each having an array of sub-pixels displaying a plurality of colors, wherein:
  a plurality of sub-pixels b displaying a first color are arranged in a first spatial isotropic configuration in the display panel;
  a plurality of sub-pixels d displaying a second color are arranged in a second spatial isotropic configuration in the display panel; and
  at least one of the first color and the second color contributes most to display resolution among the plurality of colors, wherein
the display unit is a 4×4 sub-pixel array, and
sub-pixels arranged from left to right of each row of the display unit include:
  sub-pixel a, sub-pixel b, sub-pixel c, and sub-pixel b;
  sub-pixel c, sub-pixel d, sub-pixel a, and sub-pixel d;
  sub-pixel b, sub-pixel a, sub-pixel b, and sub-pixel c;
  sub-pixel d, sub-pixel c, sub-pixel d, and sub-pixel a,
  wherein each of the sub-pixel a, the sub-pixel b, the sub-pixel c, and the sub-pixel d displays a color different from one another.

7. The display panel according to claim 6, wherein a structure of the 4×4 sub-pixel array has one of following configurations arranged from left to right of each row including:
RGBG, BWRW, GRGB, and WBWR;
RWBW, BGRG, WRWB, and GBGR;
BGRG, RWBW, GBGR, and WRWB; and
BWRW, RGBG, WBWR, and GRGB,
wherein R represents a sub-pixel of the red color, G represents a sub-pixel of the green color, B represents a sub-pixel of the blue color, and W represents a sub-pixel of the white color.

8. The display panel according to claim 1, wherein a structure of the display unit has one of following combinations arranged from left to right of each row including:
RGRWBGBW, and BWBGRWRG;
BGBWRGRW, and RWRGBWBG;
RWRGBWBG, and BGBWRGRW;
BWBGRWRG, and RGRWBGBW;
GRGRWBWB, and WBWBGRGR;
GBGBWRWR, and WRWRGBGB;
WRWRGBGB, and GBGBWRWR;
WBWBGRGR, and GRGRWBWB;
GRGRGBGB, and WBWBWRWR;
GBGBGRGR, and WRWRWBWB;
WRWRWBWB, and GBGBGRGR; and
WBWBWRWR, and GRGRGBGB,
wherein R represents a sub-pixel of the red color, G represents a sub-pixel of the green color, B represents a sub-pixel of the blue color, and W represents a sub-pixel of the white color.

9. The display panel according to claim 5, wherein:
two adjacent sub-pixels both displaying the red color or the blue color form a sub-pixel unit and are controlled by a same sub-pixel driving circuit.

10. The display panel according to claim 1, wherein after rotating, transposing, or reversing the display units, the display units are stacked repeatedly to form the display panel.

11. A pixel structure, comprising:
a plurality of sub-pixels in an array structure each sub-pixel displaying one of a plurality colors,
wherein, when a plurality of pixel structures arranged repeatedly to form a display panel,
a plurality of sub-pixels b displaying a first color are arranged in a first spatial isotropic configuration in the display panel;
a plurality of sub-pixels d displaying a second color are arranged in a second spatial isotropic configuration in the display panel; and
at least one of the first color and the second color contributes most to display resolution among the plurality of colors, wherein
the sub-pixel array is a 4×4 sub-pixel array and,
sub-pixels arranged from left to right in each row of the pixel structure include:
  sub-pixel a, sub-pixel b, sub-pixel c, and sub-pixel b;
  sub-pixel c, sub-pixel d, sub-pixel a, and sub-pixel d;
  sub-pixel b, sub-pixel a, sub-pixel b, and sub-pixel c;
  sub-pixel d, sub-pixel c, sub-pixel d, and sub-pixel a; and
each of the sub-pixel a, the sub-pixel b, the sub-pixel c, and the sub-pixel d displays a color different from one another.

* * * * *